(12) United States Patent
Jobanputra et al.

(10) Patent No.: US 8,321,386 B1
(45) Date of Patent: Nov. 27, 2012

(54) SYSTEM AND METHOD FOR ESTIMATING A COMPRESSIBILITY OF DATA IN A STORAGE DEVICE

(75) Inventors: Varun Jobanputra, San Jose, CA (US); Sandeep Yadav, Santa Clara, CA (US)

(73) Assignee: NetApp, Inc., Sunnyvale, CA (US)

( * ) Notice: Subject to any disclaimer, the term of this patent is extended or adjusted under 35 U.S.C. 154(b) by 407 days.

(21) Appl. No.: 12/102,489

(22) Filed: Apr. 14, 2008

(51) Int. Cl.
*G06F 7/00* (2006.01)
*G06F 17/00* (2006.01)

(52) U.S. Cl. ........................................ 707/693; 717/168

(58) Field of Classification Search ................ 707/693, 707/812, 821, 817, 999.002, 999.101, 999.205; 711/100, 112, 171, 201, 204, 205, 213; 717/168, 717/172
See application file for complete search history.

(56) References Cited

U.S. PATENT DOCUMENTS

| | | | | |
|---|---|---|---|---|
| 5,627,533 A * | 5/1997 | Clark | ............................... | 341/51 |
| 5,675,789 A * | 10/1997 | Ishii et al. | ............................... | 1/1 |
| 6,000,009 A * | 12/1999 | Brady | ............................ | 711/112 |
| 7,305,490 B2 * | 12/2007 | Metz et al. | ..................... | 709/247 |
| 7,774,572 B2 * | 8/2010 | Yokohata et al. | ............. | 711/171 |
| 2005/0210054 A1 * | 9/2005 | Harris | ............................ | 707/101 |
| 2008/0154928 A1 * | 6/2008 | Bashyam et al. | ............. | 707/101 |
| 2009/0043792 A1 * | 2/2009 | Barsness et al. | ............. | 707/101 |
| 2009/0248725 A1 * | 10/2009 | Bhattacharjee et al. | ...... | 707/101 |
| 2009/0254513 A1 * | 10/2009 | Luukkala et al. | ................. | 707/2 |

OTHER PUBLICATIONS

Yadav et al., U.S. Appl. No. 11/846,033, filed Aug. 28, 2007.

* cited by examiner

*Primary Examiner* — Greta Robinson
(74) *Attorney, Agent, or Firm* — Zilka-Kotab, PC

(57) ABSTRACT

A system and method are provided for estimating compressibility of data in a storage device. This is accomplished by actually running a compression algorithm on at least one data element in a storage device, without necessarily storing the compressed data. By this feature, the results of the compression may be compared with the original data element, to gauge an extent to which a compression algorithm is effective in compressing data in the storage device. To this end, in various embodiments, a user may be better able to estimate compression algorithm effectiveness before actually implementing the same.

23 Claims, 4 Drawing Sheets

SYSTEM AND METHOD FOR ESTIMATING A COMPRESSIBILITY OF DATA IN A STORAGE DEVICE

FIELD OF THE INVENTION

The present invention relates to storage systems and, more specifically, to a technique for estimating space savings of data compression in a storage device.

BACKGROUND

A storage system typically comprises one or more storage devices into which information may be entered, and from which information may be obtained, as desired. The storage system includes a storage operating system that functionally organizes the system by, inter alia, invoking storage operations in support of a storage service implemented by the system. The storage system may be implemented in accordance with a variety of storage architectures including, but not limited to, a network-attached storage environment, a storage area network and a disk assembly directly attached to a client or host computer. The storage devices are typically disk drives organized as a disk array, managed according to a storage protocol, wherein the term "disk" commonly describes a self-contained rotating magnetic media storage device. The term disk in this context is synonymous with hard disk drive (HDD) or direct access storage device (DASD).

The foregoing storage systems are often equipped with a variety of compression algorithms for transparently compressing data when such data is written to a storage device. Storage savings vary from dataset to dataset. Thus, it is sometimes hard to estimate how much compressible data exists in a storage device before actually installing a compression-enabled operating system, etc. This may present challenges from a storage administrator's perspective, as it is important to understand how much compressible data exists in a storage device so that the administrator may effectively provision storage space.

There is thus a need for addressing these and/or other issues associated with the prior art.

SUMMARY

A system and method are provided for estimating a compressibility of data in a storage device. This is accomplished by actually running a compression algorithm on at least one data element in a storage device, without necessarily storing the compressed data. By this feature, the results of the compression may be compared with the original data element, to gauge an extent to which a compression algorithm is effective in compressing data in the storage device. To this end, in various embodiments, a user may be better able to estimate compression algorithm effectiveness before actually implementing the same.

In one exemplary embodiment, a data element of a first size is retrieved from a storage device. Such data element is then compressed utilizing a compression algorithm that is unsupported by the storage device, and a second size of the compressed data element is determined. Such first size and the second size are then automatically compared for displaying results to gauge a compressibility of the data element if the compression algorithm were to be supported by the storage device.

In various embodiments, the aforementioned data element may include a file. Further, a user may be permitted to select one of a plurality of compression algorithms for compressing the data element. For example, in one embodiment, a first compression algorithm may be selected from a set of compression algorithms for compressing the data element to the second size. Still yet, a second compression algorithm may be selected from the set of compression algorithms for compressing the data element to a third size. To this end, the first size may be automatically compared with the second size as well as the third size, for contrasting the first and second compression algorithm. Of course, an additional compression algorithm may be added to the set of compression algorithms, as desired.

In additional embodiments, the aforementioned data retrieval and compression may occur over a network such that the results of the comparison are displayed utilizing a client in communication with the storage device over a network. As an option, the results of the comparison may include a graphical format, a textual format, etc.; and may even be user configurable. Still yet, the aforementioned techniques may be access-protocol independent in that a plurality of the data elements may be retrieved utilizing a plurality of different protocols.

DETAILED DESCRIPTION

A system and method are provided for estimating a compressibility of data in a storage device. This is accomplished by actually running a compression algorithm on at least one data element in a storage device, without necessarily storing the compressed data. By this feature, the results of the compression may be compared with the original data element, to gauge an extent to which a compression algorithm is effective in compressing data in the storage device.

In one exemplary embodiment, a data element of a first size is retrieved from a storage device. Such data element is then compressed and a second size of the compressed data element is determined. Such first size and the second size are then automatically compared for displaying results.

To this end, in various embodiments, a user may be better able to estimate compression algorithm effectiveness before actually implementing a particular compression algorithm. More information will now be set forth regarding the underlying features with which the foregoing technique is made possible, according to various embodiments.

Figure 1:
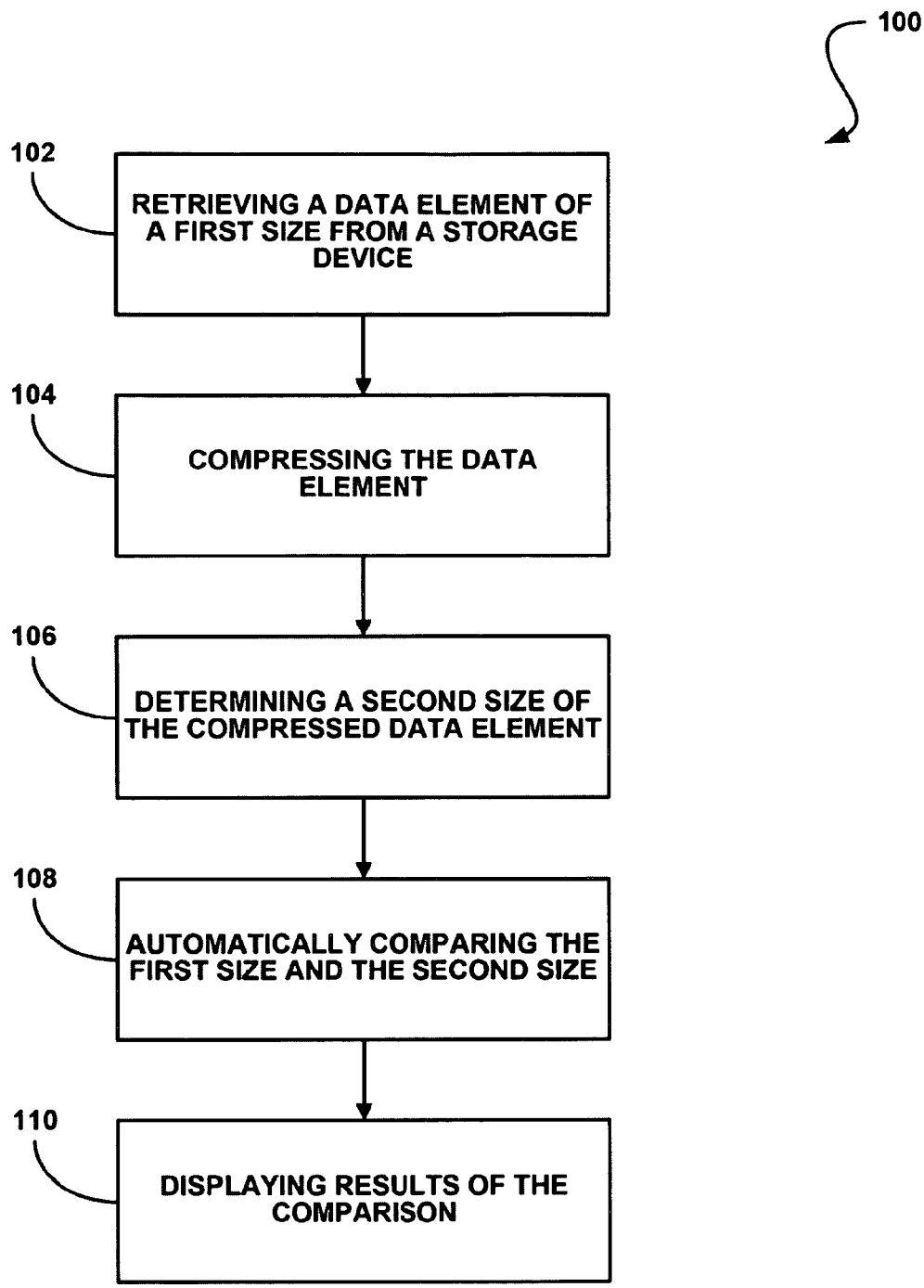
FIG. 1 illustrates a method for estimating a compressibility of data in a storage device, in accordance with one embodiment.

FIG. 1 illustrates a method 100 for estimating a compressibility of data in a storage device, in accordance with one embodiment. As shown, a data element of a first size is retrieved from a storage device, as indicated in operation 102. In the context of the present description, such data element may refer to any data stored in the storage device. For instance, the data element may, in one possible embodiment, include a file. While only one data element is shown to be retrieved in operation 102, it should be noted that any number of data elements may be retrieved, as desired.

Moreover, the storage device may include any device capable of storing the data element. For example, in one embodiment, the storage device may be locally situated for retrieval of the data element. In another embodiment, the storage device may be remotely located for retrieval of the data element via a network [e.g. local area network (LAN), wide area network (WAN), etc.]. Still yet, the aforementioned retrieval techniques may be access-protocol independent in that a plurality of the data elements may be retrieved utilizing a plurality of different protocols.

In one embodiment, the data element may be manually selected by a user. For example, a file structure may be used to identify the data element. In one example of use, a user may select a directory of the file structure, such that all of the data elements therein are retrieved. In other embodiment, a procedure may be executed for retrieving the data element(s) in an automated manner (e.g. by sampling the data, retrieving an entire volume, etc.).

Such data element is then compressed in operation 104, utilizing a compression algorithm that is unsupported by the storage device. In other words, during operation 104, the compression algorithm is not necessarily implemented on the storage device, at least in part. In the context of the present description, such compression may take the form of any compression algorithm capable of compressing the data element. Just by way of example, such compression algorithm may include a LZ77 algorithm, an LZS compression algorithm, a WINZIP compression algorithm, and/or any other compression algorithm, for that matter. In various embodiments, a user may be permitted to select one of a plurality of compression algorithms for compressing the data element per operation 104.

Next, in operation 106, a second size of the compressed data element is determined. This may be accomplished by inspecting a number of bytes the data requires for storage. In one embodiment, such size may be identified without necessarily storing the data element. For example, an output data rate of the compression algorithm may be monitored for calculating an effective storage size (e.g. by multiplying the monitored rate by time, etc.) Of course, other embodiments are contemplated where the compressed data is stored before identifying a size thereof.

Such first size and the second size are then automatically compared for displaying results to gauge a compressibility of the data element if the compression algorithm were to be supported (e.g. implemented, etc.) by the storage device. See operation 108. In the context of the present description, such comparison may involve any operation involving both the first size and the second size. For example, a difference between the first size and the second size may be calculated. Such difference may thus indicate an effectiveness of the compression algorithm. For instance, if the second size is much less than the first size, this may be an indication that the compression algorithm is highly effective.

With continuing reference to FIG. 1, the results are displayed. See operation 110. In different embodiments, the results of the comparison may include a graphical format, a textual format, etc.; and may even be user configurable.

In one embodiment wherein the comparison is carried out remotely, the aforementioned data retrieval and compression may occur over a network such that the results of the comparison are displayed utilizing a client in communication with the storage device over a network. Of course, other embodiments are contemplated whereby the method 100 of FIG. 1 may be carried out by a device locally coupled to the storage device.

While the foregoing embodiment outlines a method for gauging a single compression algorithm, other embodiments are contemplated whereby multiple compression algorithms may be selected in operation 104 for comparing results of such compression. For example, in one embodiment, a first compression algorithm may be selected from a set of compression algorithms for compressing the data element to the second size. Still yet, a second compression algorithm may be selected from the set of compression algorithms for compressing the data element to a third size. To this end, the first size may be automatically compared with the second size and the first size may be automatically compared with the third size, for contrasting the first and second compression algorithm. Of course, an additional compression algorithm may be added to the set of compression algorithms, as desired.

More illustrative information will now be set forth regarding various optional architectures and features of different embodiments with which the foregoing technique may or may not be implemented, per the desires of the user. It should be strongly noted that the following information is set forth for illustrative purposes and should not be construed as limiting in any manner. Any of the following features may be optionally incorporated with or without the other features described.

Figure 2:
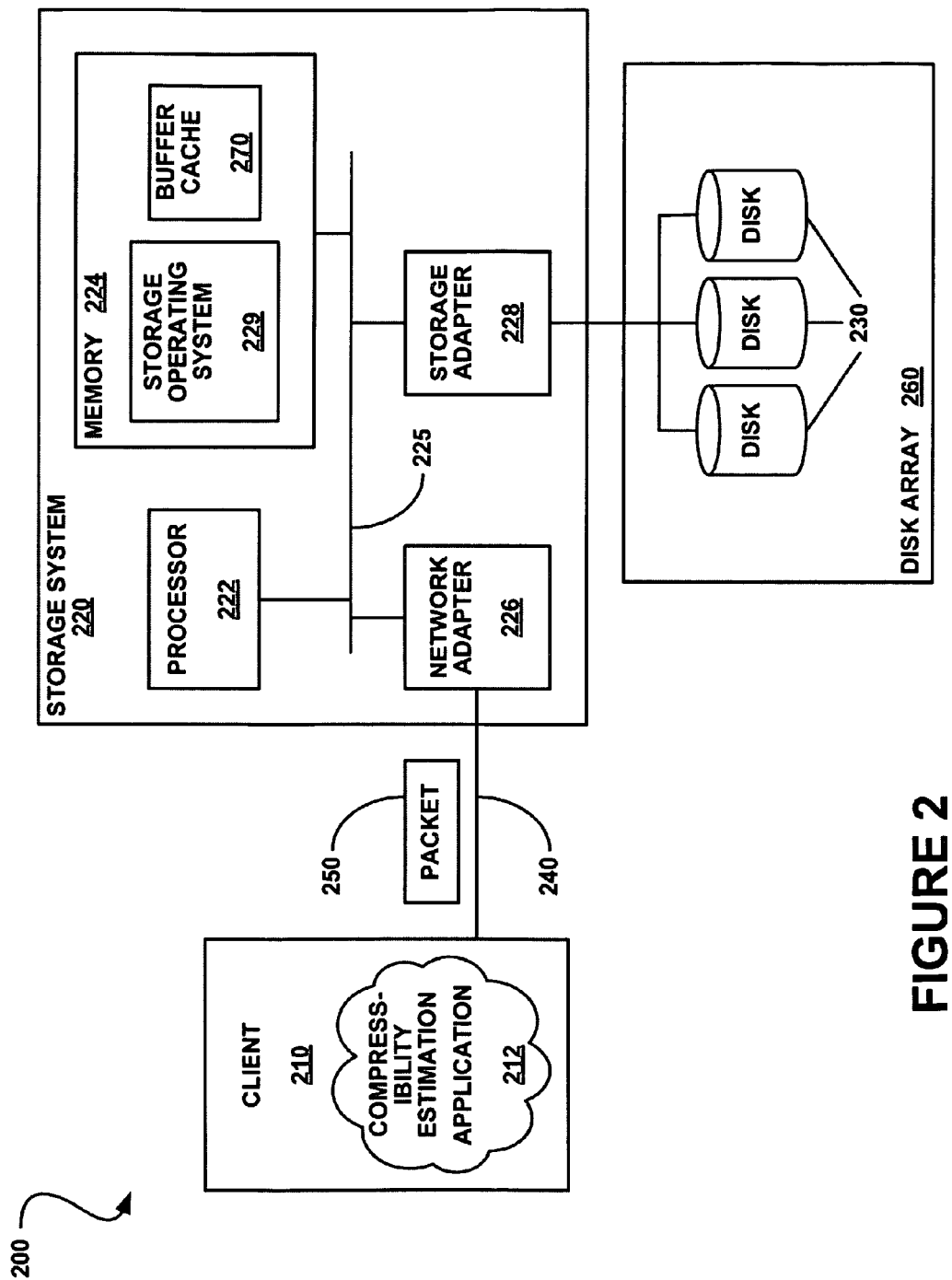
FIG. 2 illustrates a storage system environment including a storage system that may be used in one embodiment.

FIG. 2 illustrates a storage system environment 200 including a storage system 220 that may be used in one embodiment. As an option, the system 200 may be implemented to carry out the functionality of FIG. 1. Of course, however, the system 200 may be implemented in any desired environment. It should be noted that the definitions provided above equally apply to the present description.

The storage system 220 is a computer that provides storage service relating to the organization of information on storage devices, such as disks 230 of a disk array 260. The storage system 220 comprises a processor 222, a memory 224, a network adapter 226 and a storage adapter 228 interconnected by a system bus 225. The storage system 220 also includes a storage operating system 229 that illustratively implements a high-level module, such as a file system, to logically organize the information as a hierarchical structure of data containers, such as directories, files, and special types of files called virtual disks (hereinafter "blocks") on the disks.

In the illustrative embodiment, the memory 224 comprises storage locations that are addressable by the processor 222 and adapters for storing software program code. A portion of the memory may be further organized as a "buffer cache" 270 for storing data structures. The processor 222 and adapters may, in turn, comprise processing elements and/or logic circuitry configured to execute the software program code and to manipulate the data structures. Storage operating system, portions of which are typically resident in memory and executed by the processing elements, functionally organizes the system 220 by, inter alia, invoking storage operations executed by the storage system. It will be apparent to those skilled in the art that other processing and memory, including various computer readable media, may be used for storing and executing program instructions pertaining to the inventive technique described herein.

The network adapter 226 comprises the mechanical, electrical and signaling circuitry needed to connect the storage system 220 to a client 210 over a computer network 240, which may comprise a point-to-point connection or a shared medium, such as a local area network. Illustratively, the computer network 240 may be embodied as an Ethernet network or a Fibre Channel (FC) network. The client 210 may communicate with the storage system over network 240 by exchanging discrete frames or packets 250 of data according to pre-defined protocols, such as the Transmission Control Protocol/Internet Protocol (TCP/IP).

The client 210 may be a general-purpose computer configured to execute applications, such as a compressibility estimation application 212. Moreover, the client 210 may interact with the storage system 220 in accordance with a client/server model of information delivery. That is, the client 210 may request the services of the storage system 220, and the system may return the results of the services requested by the client 210, by exchanging packets 250 over the network 240. The client 210 may issue packets including file-based access protocols, such as the Common Internet File System (CIFS) protocol or Network File System (NFS) protocol, over TCP/IP when accessing information in the form of files and directories. Alternatively, the client 210 may issue packets including block-based access protocols, such as the Small Computer Systems Interface (SCSI) protocol encapsulated over TCP (iSCSI) and SCSI encapsulated over Fibre Channel (FCP), when accessing information in the form of blocks. Additionally, it should be noted that the client 210 may be configured to run on any operating system, such as any Windows operating system, Mac operating system, Solaris, Linux, or any other Unix operating system, etc.

The compressibility estimation application 212 illustratively performs estimation of compression of data on the storage system 220 in accordance with an illustrative embodiment. It should be noted that in alternative embodiments, the compressibility estimation application 212 may be, e.g., integrated within an operating system (not shown) of the client 210. Furthermore, the compressibility estimation application 212 may also be integrated within the storage operating system of the storage system 220. However, the separate compressibility estimation application 212 may be useful in an environment wherein the storage operating system does not support compression. Here, the compressibility estimation application 212 may be utilized to identify an estimate of the potential storage savings available by upgrading to a storage operating system that supports, i.e., incorporates, compression functionality. In one embodiment, the compressibility estimation application 212 may be utilized to identify an estimate of such potential storage savings utilizing the method 100 of FIG. 1. More information regarding another possible method by which the compressibility estimation application 212 may operate will be described in greater detailed during reference to a subsequent embodiment illustrated in FIGS. 3-4.

As such, description of the compressibility estimation application 212 executing on client 210 should be taken as exemplary only. Furthermore, in alternative embodiments, the compressibility estimation application 212 may be configured to execute automatically. For example, the compressibility estimation application may be configured to execute, without a direct user invocation, on, e.g., a predefined schedule, etc.

The storage adapter 228 cooperates with the storage operating system executing on the system 220 to access information requested by a user (or client). The information may be stored on any type of attached array of writable storage device media such as video tape, optical, DVD, magnetic tape, bubble memory, electronic random access memory, micro-electro mechanical and any other similar media adapted to store information, including data and parity information. However, as illustratively described herein, the information is preferably stored on disks 230, such as hard disk drives (HDDs) and/or direct access storage devices (DASDs), of array 260. The storage adapter 228 includes input/output (I/O) interface circuitry that couples to the disks 230 over an I/O interconnect arrangement, such as a conventional high-performance, FC serial link topology.

Storage of information on array 260 may be implemented as one or more storage "volumes" that comprise a collection of physical storage disks 230 cooperating to define an overall logical arrangement of volume block number (vbn) space on the volume(s). Each logical volume is generally, although not necessarily, associated with its own file system. The disks within a logical volume/file system are typically organized as one or more groups, wherein each group may be operated as a Redundant Array of Independent (or Inexpensive) Disks (RAID), managed according to a RAID protocol. Most RAID implementations, such as a RAID-4 level implementation, enhance the reliability/integrity of data storage through the redundant writing of data "stripes" across a given number of physical disks in the RAID group, and the appropriate storing of parity information with respect to the striped data. The illustrative RAID protocol also implements a 32-bit checksum value for each block of data written to disk, to verify data integrity. The illustrative example of a RAID implementation is a RAID-4 level implementation, although it should be understood that other types and levels of RAID implementations may be used in accordance with the inventive principles described herein. Likewise, other implementations and/or protocols may be used to organize the disks of the logical volume/file system.

To facilitate access to the disks 230, the storage operating system 200 may implement a write-anywhere file system that cooperates with virtualization modules to "virtualize" the storage space provided by disks 230. Illustratively, the file system logically organizes the information as a hierarchical structure of named data containers, such as directories and files on the disks. Each "on-disk" file may be implemented as set of disk blocks configured to store information, such as data, whereas the directory may be implemented as a specially formatted file in which names and links to other files and directories are stored. The virtualization modules allow the file system to further logically organize information as a hierarchical structure of data containers, such as blocks on the disks that are exported as named logical unit numbers (luns).

In the illustrative embodiment, the storage operating system is preferably the NetApp® Data ONTAP® operating system available from Network Appliance, Inc., Sunnyvale, Calif., that implements a Write Anywhere File Layout (WAFL®) file system. However, it is expressly contemplated that any appropriate storage operating system may be enhanced for use in accordance with the inventive principles described herein. As such, where the term "Data ONTAP" is employed, it should be taken broadly to refer to any storage operating system that is otherwise adaptable to the teachings of this invention.

Figure 3A:
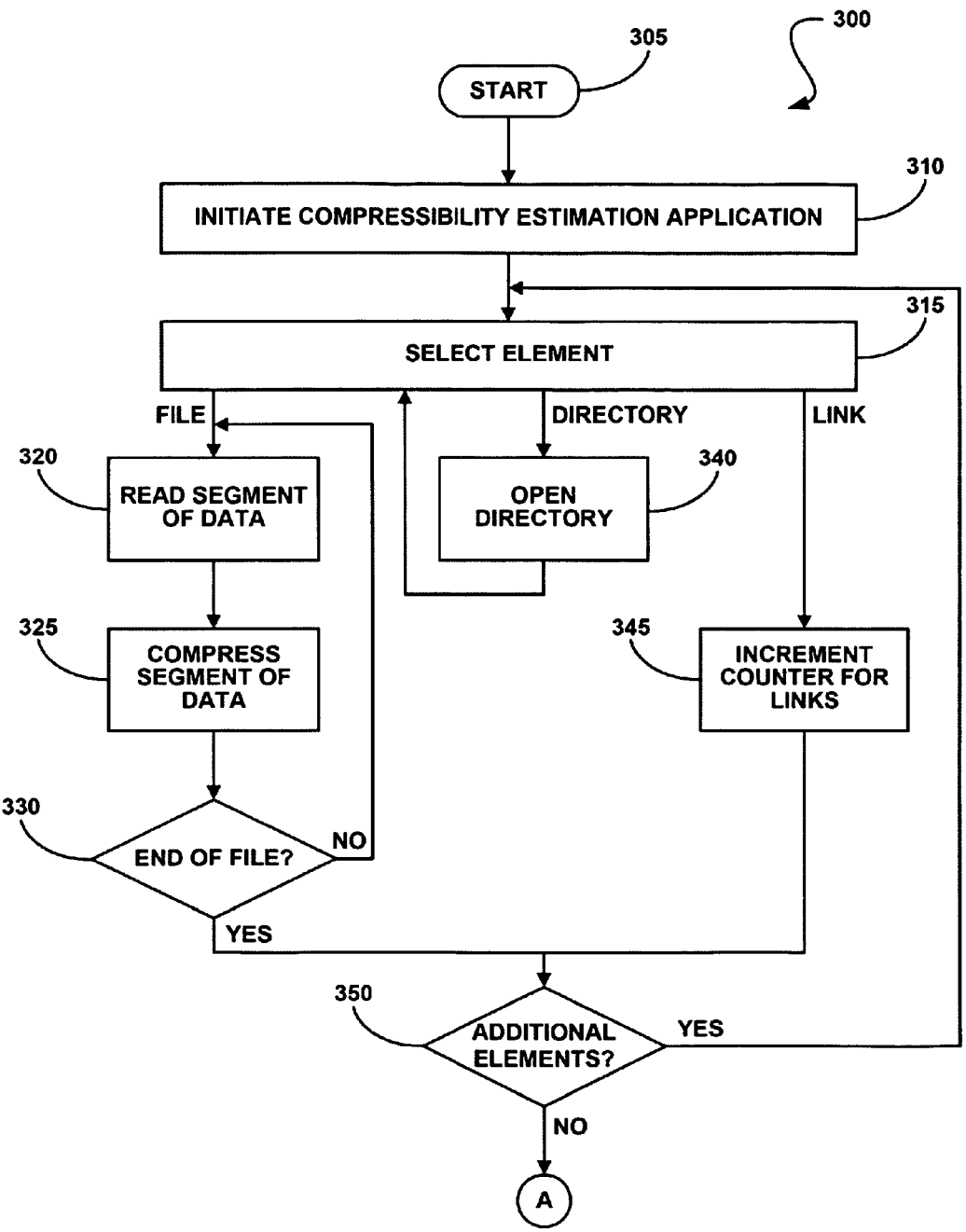
FIGS. 3A-3B includes a flow chart detailing the steps of a method for estimating a compressibility of data in accordance with an illustrative embodiment.
Figure 3B:
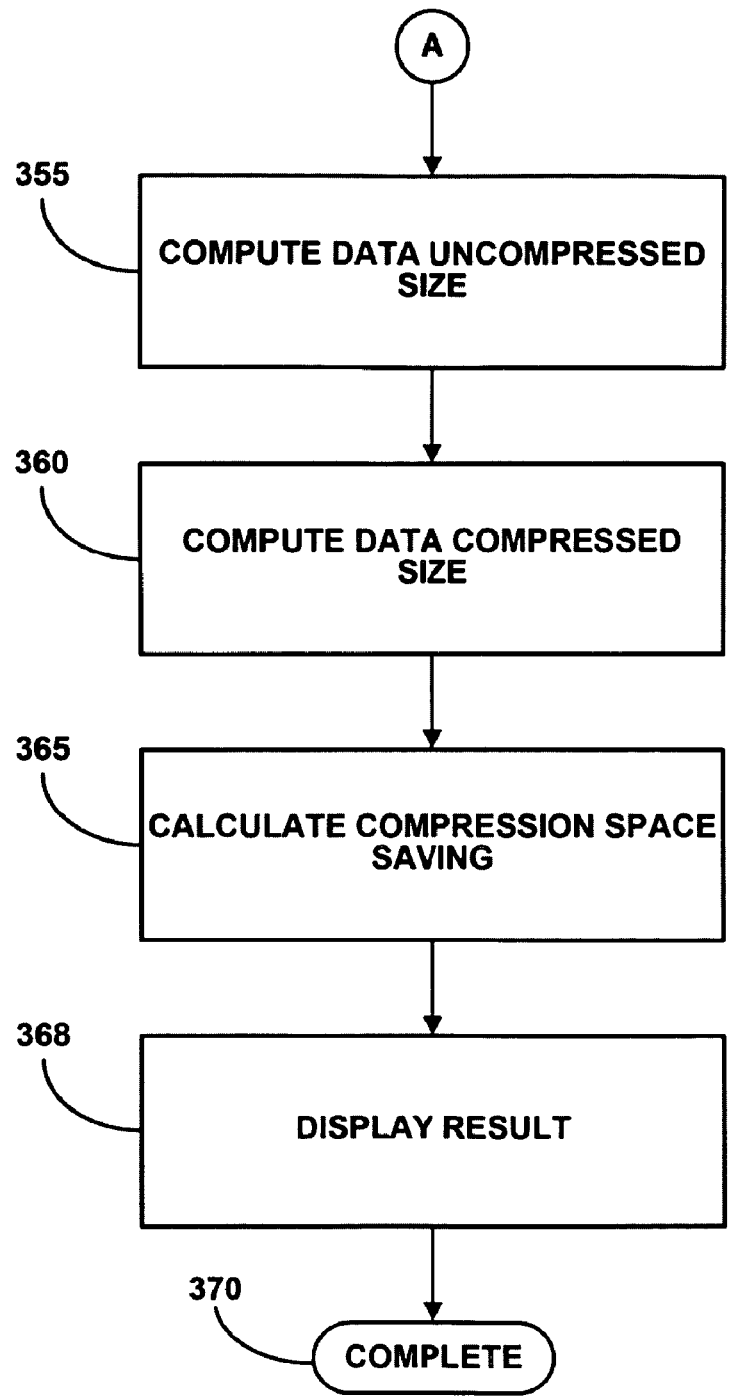

FIGS. 3A-3B includes a flow chart detailing the steps of a method 300 for estimating a compressibility of data in accordance with an illustrative embodiment. The procedure 300 begins in step 305 and continues to step 310 where a compressibility estimation application (e.g. compressibility estimation application 212 of FIG. 2) is initiated. Illustratively, the compressibility estimation application may be initiated by, e.g., an administrator executing the compressibility estimation application on a client (e.g. client 210). However, in alternative embodiments the compressibility estimation application may be integrated with, e.g., the storage operating system.

In such alternative embodiments, the application may be executed by user command, by preprogrammed and/or automated systems, etc. As such, the initiation of the compressibility estimation application by an administrator executing a command should be taken as exemplary only. Illustratively, when the administrator executes the compressibility estimation application, the administrator identifies a target data store. Illustratively, the data store may comprise, e.g., a file system, a volume, a single file, group of files, a directory and/or subdirectories within the file system, etc.

For example, an administrator may desire to determine the amount of compression data within the/user directory of a storage system while disregarding potential compression data within other directories of the storage system. In response, the compressibility estimation application first selects an element from the identified data store in step 315. In accordance with an illustrative embodiment, an element may comprise, e.g., a file or other data container, such as a directory, a link, etc. In response to selecting, e.g., a file the application reads a segment of data from the file in step 320.

In step 325, the compressibility estimation application compresses the segment of data. This may be performed by compressing the data segment using predetermined compression algorithm, or using user supplied compression utility or standard compression library. In step 330, a determination is made whether the end of the file has been reached. If the end of the file has not been reached, the procedure loops back to step 320 where the application reads the next segment of data.

Different file systems may use different block sizes (e.g. 4096 bytes, 8192 bytes, etc.), and any appropriate block size can be passed to the tool at the invocation. Further, different numbers of blocks can be used in a group to compress together (e.g. 4, 8, N), and appropriate groups of blocks may be passed to the compressibility estimation application at the invocation. The default number for groups of blocks that the tool uses may be 8, in one embodiment.

However, if the end of the file has been reached, the procedure continues to step 350 where a determination is made as to whether additional elements exist that are to be scanned (selected). If there are additional elements, the procedure loops back to step 315 where the next element is selected.

However, if there are no additional elements to be compressed, the compressibility estimation application computes a total size of the uncompressed data in step 355. In addition, a total size of the compressed data is computed in step 360. With this information, the compressibility estimation application may calculate the estimated savings for the compression of the data set in step 365. Further, such estimated savings may be displayed in step 368, before termination in step 370. Illustratively, the amount of savings may be equal to the uncompressed data total size minus the compressed data size.

In an alternative embodiment, the estimate of compressibility of the data may be utilized to determine the amount of space savings possible by applying the compression algorithm on the data store. As set forth above, the data store may comprise, e.g., a file system, a volume, a single file, group of files, a directory and/or subdirectories within the file system, etc. Furthermore, in other alternative embodiments, the estimate of compression data may be utilized to determine the amount of bandwidth saved by transmitting compressed data over a network compared to non-compressed data. As such, the present embodiment may generally be utilized to determine an estimate of compression data in a particular data store. It should be noted that other uses for the estimate of compression data may be utilized in accordance with other embodiments. As such, the description of using the estimate for space savings and/or bandwidth savings should be taken as exemplary only.

If, in step 315, it is determined that the data element is a directory, the method 300 branches to step 340 where the directory is opened. The method then loops back to step 315 where the data elements within the directory are opened. Also, in step 315, if it is determined that the data element is a link, such as a symbolic link or a hard link, the compressibility estimation application records state, e.g., increments a counter stored in memory of a client, for the link identifying which data is referenced by the link. A symbolic link refers to a file that contains a reference to another file or directory in the form of an absolute or relative path and that affects pathname resolution. On the other hand, a hard link refers to a reference, or pointer, to physical data on a storage volume.

Due to symbolic/hard links, the compressibility estimation application may run into the same file multiple times when there is a desire not to overestimate space savings due to links. In other words, the same data may be discovered as a result of traversing the links, which may give the impression that more data is present, when it is not. Thus, when the compressibility estimation application compares the end-result compressed data size with such overstated initial data size, an overestimation of space savings results.

To address this, an inode file number may be stored in a hash table when a link is encountered. Before processing a new file, such inode file number may be looked up in a hash table. If the inode file number is already in the hash table, the compressibility estimation application may skip such entry after incrementing a link-count counter for reporting purposes and process the next entry. To this end, the same data may not be counted more than once, when determining the compressibility of the data.

The present application may thus be used to estimate a storage savings that would result from a particular compression of an associated storage system, while a dataset is currently stored in a different type of storage system. This may be beneficial when illustrating to potential customers estimated storage savings that would result from compression, before actually installing the associated operating system, etc. for running the relevant compression. Further, development engineers may use the same to estimate an effect of variable data block sizes and variable number/group of blocks on compression, or an impact of using different compression algorithms. In any case, the compressibility of data that would result from a particular compression product may be determined, without necessarily installing the product.

The foregoing description has set forth only a few of the many possible implementations. For this reason, this detailed description is intended by way of illustration, and not by way of limitations. Variations and modifications of the embodiments disclosed herein may be made based on the description set forth herein, without departing from the scope and spirit of the present application.

It is only the following claims, including all equivalents, that are intended to define the scope of the various embodiments. Moreover, the embodiments described above are specifically contemplated to be used alone as well as in various combinations. Accordingly, other embodiments, variations, and improvements not described herein are not necessarily excluded.

What is claimed is:

1. A method, comprising:
   retrieving a data element of a first size at a client from a storage system separate from the client, the storage system including a storage device and a storage operating system that organizes data including the data element within the storage device;
   compressing the data element at the client utilizing a compression algorithm that is unsupported by the storage system, the compression algorithm being unsupported by the storage system by virtue of the compression algorithm being implemented on the client and not being implemented by the storage operating system of the storage system;

determining a second size of the compressed data element by monitoring an output data rate of the compression algorithm without storing the compressed data element, and by multiplying the output data rate by a factor of time;

automatically comparing the first size and the second size; and displaying results of the comparison to gauge a compressibility of the data element if the compression algorithm were to be supported by the storage operating system of the storage system, by displaying an estimated savings resulting from the compression of the data element;

wherein the results of the comparison are displayed utilizing the client in communication with the storage system over a network;

wherein the retrieving, the compressing, and the comparing occur at the client in communication with the storage system over the network;

wherein an operating system of the storage system does not support the compression of the data element, another operating system other than the operating system of the storage system does support the compression of the data element, and the results of the comparison are used to identify storage savings available by upgrading the storage system to the other operating system.

2. The method of claim 1, wherein the data element includes a file.

3. The method of claim 1, and further comprising selecting one of a plurality of compression algorithms for compressing the data element.

4. The method of claim 1, and further comprising selecting a first compression algorithm from a set of compression algorithms for compressing the data element to the second size, and further selecting a second compression algorithm from the set of compression algorithms for compressing the data element to a third size.

5. The method of claim 4, wherein the first size is automatically compared with the second size, and the first size is automatically compared with the third size.

6. The method of claim 4, and further comprising adding an additional compression algorithm to the set of compression algorithms for compressing the data element.

7. The method of claim 1, wherein the second size is determined without storing the compressed data element, and further comprising discarding the compressed data element after determining the second size.

8. The method of claim 1, and further comprising storing the compressed data element after determining the second size.

9. The method of claim 1, wherein the results of the comparison includes a graphical format.

10. The method of claim 1, wherein the results of the comparison includes a textual format.

11. The method of claim 1, wherein a format of the results of the comparison is user configurable.

12. The method of claim 1, wherein a plurality of the data elements are retrieved utilizing a plurality of protocols.

13. The method of claim 1, further comprising utilizing the results of the comparison to determine an amount of space savings possible by applying the compression algorithm on the storage system.

14. The method of claim 1, further comprising utilizing the results of the comparison to determine an amount of bandwidth saved by transmitting compressed data over a network compared to transmitting non-compressed data over the network.

15. The method of claim 1, wherein the compression algorithm is not implemented on the storage system by not being installed on the storage system, such that the estimated savings resulting from the compression of the data element is determined without installing the compression algorithm on the storage system.

16. The method of claim 1, wherein the comparing includes calculating a difference between the first size and the second size.

17. The method of claim 1, further comprising determining whether the data element is a symbolic link, the symbolic link including a file that contains a reference to another file or directory in the form of an absolute or relative path.

18. The method of claim 1, further comprising storing an mode file number for the symbolic link in a hash table, when it is determined that the data element is a symbolic link.

19. A computer program product embodied on a computer readable medium, comprising:

computer code for retrieving a data element of a first size at a client from a storage system separate from the client, the storage system including a storage device and a storage operating system that organizes data including the data element within the storage device;

computer code for compressing the data element at the client utilizing a compression algorithm that is unsupported by the storage system, the compression algorithm being unsupported by the storage system by virtue of the compression algorithm being implemented on the client and not being implemented by the storage operating system of the storage system;

computer code for determining a second size of the compressed data element by monitoring an output data rate of the compression algorithm without storing the compressed data element, and by multiplying the output data rate by a factor of time;

computer code for automatically comparing the first size and the second size; and computer code for displaying results of the comparison to gauge a compressibility of the data element if the compression algorithm were to be supported by the storage operating system of the storage system, by displaying an estimated savings resulting from the compression of the data element;

wherein the computer program product is operable such that the results of the comparison are displayed utilizing a client in communication with the storage system over a network;

wherein the retrieving, the compressing, and the comparing occur at the client in communication with the storage system over the network;

wherein an operating system of the storage system does not support the compression of the data element, another operating system other than the operating system of the storage system does support the compression of the data element, and the results of the comparison are used to identify storage savings available by upgrading the storage system to the other operating system.

20. The computer program product of claim 19, wherein the second size is determined without storing the compressed data element, and further comprising computer code for discarding the compressed data element after determining the second size.

21. The computer program product of claim 19, and further comprising computer code for storing the compressed data element after determining the second size.

22. A system, comprising:
a storage system for storing a data element of a first size, the storage system including a storage device and a storage operating system that organizes data including the data element within the storage device; and
a client including a processor in communication with the storage system separate from the client for retrieving the data element for compressing the same at the client separate from the storage system utilizing a compression algorithm that is unsupported by the storage system, and automatically comparing the first size with a second size of the compressed data element, for display purposes to gauge a compressibility of the data element if the compression algorithm were to be supported by the storage operating system of the storage system, by displaying an estimated savings resulting from the compression of the data element;
wherein the compression algorithm is unsupported by the storage system by virtue of the compression algorithm being implemented on the client separate from the storage system and not being implemented by the storage operating system of the storage system;
wherein the second size of the compressed data element is determined by monitoring an output data rate of the compression algorithm without storing the compressed data element, and by multiplying the output data rate by a factor of time;
wherein the results of the comparison are displayed utilizing a client in communication with the storage system over a network;
wherein the retrieving, the compressing, and the comparing occur at the client in communication with the storage system over the network;
wherein an operating system of the storage system does not support the compression of the data element, another operating system other than the operating system of the storage system does support the compression of the data element, and the results of the comparison are used to identify storage savings available by upgrading the storage system to the other operating system.

23. The system of claim 22, wherein the processor remains in communication with the storage system over a network.

* * * * *